United States Patent
Ohmi

[11] Patent Number: 5,840,368
[45] Date of Patent: Nov. 24, 1998

[54] APPARATUS FOR FORMING LOW-TEMPERATURE OXIDE FILMS AND METHOD OF FORMING LOW-TEMPERATURE OXIDE FILMS

[76] Inventor: Tadahiro Ohmi, 1-17-301, Komegabukuro 2-chome, Aoba-ku, Miyagi-ken 980, Japan

[21] Appl. No.: 428,154

[22] PCT Filed: Nov. 17, 1993

[86] PCT No.: PCT/JP93/01682
§ 371 Date: Jul. 24, 1995
§ 102(e) Date: Jul. 24, 1995

[87] PCT Pub. No.: WO94/11901
PCT Pub. Date: May 26, 1994

[30] Foreign Application Priority Data

Nov. 17, 1992 [JP] Japan ................................ 4-306905

[51] Int. Cl.[6] .............................. C23C 16/00; H01L 21/00
[52] U.S. Cl. ........................ 427/255.4; 438/773; 118/715
[58] Field of Search ............................. 427/255.4, 248.1, 427/255.3; 438/773, 787; 148/DIG. 118; 118/715

[56] References Cited

U.S. PATENT DOCUMENTS

| | | | |
|---|---|---|---|
| 4,267,205 | 5/1981 | Pastor et al. .............................. | 438/773 |
| 4,376,796 | 3/1983 | Arrasmith et al. ........................ | 438/773 |
| 4,599,247 | 7/1986 | Bean et al. ................................ | 438/773 |
| 5,314,846 | 5/1994 | Boitnott .................................... | 438/773 |

FOREIGN PATENT DOCUMENTS

| | | |
|---|---|---|
| 53-57776 | 5/1978 | Japan . |
| 54-21266 | 2/1979 | Japan . |
| 63-304670 | 12/1988 | Japan . |

*Primary Examiner*—Roy V. King
*Attorney, Agent, or Firm*—Marshall, O'Toole, Gerstein, Maurray & Borun

[57] ABSTRACT

The present invention aims at providing an apparatus for and a method of forming low-temperature oxide films, which are capable of forming an oxide film at a low temperature and preventing the diffusion of impurities from the outside. The apparatus for forming an oxide film at a low temperature is characterized in that it has an oxidation furnace provided with a gas supply port and a gas discharge port, a heater for heating the oxidation furnace to a predetermined temperature, and a gas supply system disposed upstream of the oxidation furnace and provided with a means for adding an arbitrary quantity of water or a means for generating an arbitrary quantity of water.

7 Claims, 11 Drawing Sheets

TREX EVALUATION

|  | PRESENT INVENTION | CONVENTIONAL EXAMPLE (QUARTZ FURNACE) |
|---|---|---|
| Fe | 2.41 | 4.79 |
| Cr | 0.79 | 0.61 |
| Ni | 0.90 | 1.69 |
| Cu | 0.21 | 2.09 |

APPARATUS FOR FORMING LOW-TEMPERATURE OXIDE FILMS AND METHOD OF FORMING LOW-TEMPERATURE OXIDE FILMS

TECHNICAL FIELD

The present invention relates to an apparatus for forming low-temperature oxide films and a method of forming low-temperature oxide films which are capable of forming an oxide film on a sample at low temperatures, and in particular, relates to an apparatus for forming low-temperature oxide films and a method of forming low-temperature oxide films which are capable of forming highly pure oxide films at low temperatures when forming oxide films on substrates in semiconductor manufacturing processes or the like.

BACKGROUND ART

Silicon oxide technology is one of the fundamental technologies in silicon device manufacturing processes; a large amount of research has been conducted in this field. However, the fact that research is being widely conducted even at present into topics ranging from surface problems to application indicates that silicon oxide technology has not yet been perfected.

In concert with miniaturization, the characteristics of devices are liable to be influenced by crystal defects in the substrate, and furthermore, as the diameter increases, twisting or warping in the silicon wafers leads to a worsening of the precision of reticle alignment, and an increase in process performance becomes difficult. It is thought that these problems will be exaggerated by the high temperature heat treatment of silicon substrates. Furthermore, in high temperature processes, the diffusion of impurities from the outside, and the like, is likely to occur, and ideal surfaces and thin film formation become difficult.

A decrease in temperature of the semiconductor processes is an effective method of solving such problems, and a reduction in the temperature of silicon oxide film formation is an important objective.

Presently, the formation of silicon oxide films is conducted by means of dry oxidation at high temperatures of 800° C. or more, and by means of wet oxidation, in which hydrogen is caused to combust in an oxygen atmosphere at a temperature of 700° C. or more, water vapor is generated, and oxidation occurs. It is known that in comparison with dry oxidation, the growth rate of the oxide film is higher in wet oxidation. Accordingly, wet oxidation was more effective when forming oxide films at low temperatures using conventional technology. However, in wet oxidation, since the combustion of hydrogen is carried out, the temperature must necessarily be that of the combustion of hydrogen, 700° C., or more.

Furthermore, oxidation processing is conducted under high pressure in order to form an oxide film having a greater film thickness at low temperatures. However, because a double walled structure comprising a quartz oxidation furnace and a stainless steel furnace was employed in such cases, impurities passed from the inner surface of the stainless steel through the quartz and were diffused, so that it was difficult to form highly pure oxide films.

Accordingly, in the conventional oxidation methods, large problems were caused by high temperature processing at temperatures of 700° C. or more and the fact that as a result, impurities passed through the quartz tube from the outside, and were diffused, and thus a highly pure atmosphere could not be formed.

The present invention has as an object thereof to provide an apparatus for forming low-temperature oxide films and a formation method which are capable of forming oxide films at low temperatures, and furthermore prevent the diffusion of impurities from the outside.

DISCLOSURE OF THE INVENTION

The apparatus for forming low-temperature oxide films in accordance with the present invention is an apparatus for forming oxide films at low temperatures, characterized in being provided with: an oxidation furnace possessing a gas supply port and a gas exhaust port; a heater for heating said oxidation furnace to an arbitrary temperature; and a gas supply system disposed upstream of said oxidation furnace and provided with a mechanism for adding an arbitrary quantity of water or a mechanism for generating an arbitrary quantity of water.

The method of forming low-temperature oxide films in accordance with the present invention is characterized in comprising: a gas supply process for supplying a gas containing water and oxygen to the interior of the oxidation furnace of an apparatus for forming low-temperature oxide films comprising an apparatus for forming oxide films at low temperatures provided with an oxidation furnace having a gas supply port and a gas exhaust port, a heater for heating the oxidation furnace to an arbitrary temperature, and a gas supply system disposed upstream of the oxidation furnace and provided with a mechanism for providing an arbitrary amount of water or a mechanism for generating an arbitrary quantity of water; and a thermal oxidation process for heating and oxidizing a sample within said oxidation furnace.

Function

The apparatus for forming low-temperature oxide films in accordance with the present invention is capable of conducting the thermal oxidation process in a highly pure manner and at high pressures of 1 $kg/cm^2$ or more, as a result of the fact that the oxidation furnace and the gas supply system comprise metallic materials and that a mechanism is provided for generating water vapor at low temperatures. Accordingly, a mixed gas of water vapor and oxygen is supplied to the oxidation furnace at low temperatures of 600° C. or less, and it is possible to form a highly pure oxide film.

Embodiment Examples

Hereinbelow, embodiment examples will be explained using the Figures.

Figure 1:
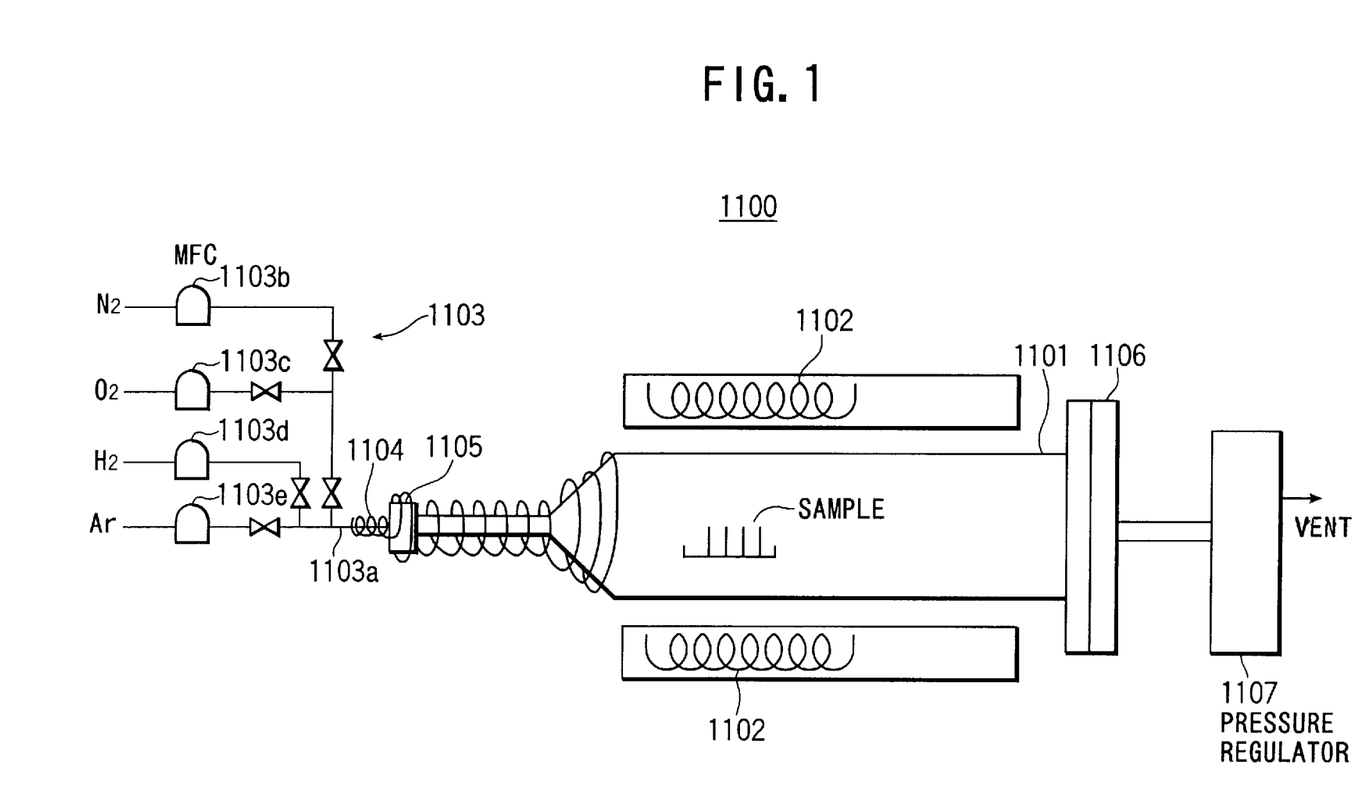
FIG. 1 is a conceptual diagram showing an embodiment example of the apparatus of the present invention.

FIG. 1 is a conceptual diagram of an apparatus showing an embodiment example of the present invention; it depicts an apparatus for forming an oxide film on a semiconductor at low temperatures.

The apparatus 1100 for forming low-temperature oxide films comprises an oxidation furnace 1101, an oxidation furnace heater 1102, a piping system 1103 comprising piping 1103a and mass flow controllers (MFC) 1103b–1103e, and piping heater 1104. Gas introduction port 1105 and gas exhaust port 1106 are attached to oxidation heater 1101, and pressure regulator 1107 is attached to the piping of gas exhaust port 1106 so that it is possible to conduct oxidation processing under high pressure.

First, the method of generating water vapor will be explained. Nitrogen, argon, oxygen, and hydrogen gases are supplied to piping system 1103, and the flow rates thereof are controlled by MFC 1103b–1103e respectively. The water vapor is generated by heating the piping 1103a having an atmosphere containing an arbitrary concentration of oxygen gas to a temperature within a range of 200° C.–600° C. using heater 1104, and adding an arbitrary concentration of hydrogen to piping 1103a. The hydrogen is dissociated by the catalytic action of the stainless steel pipe, and may be completely dissociated if it is present at low concentrations, so that for example, it is possible to generate 1% of water vapor with respect to a hydrogen concentration of 1%.

Next, an example of a method for oxide film formation at low temperatures will be explained. The water vapor which was generated in accordance with the above outline in the case of humidification oxidation under normal pressures is supplied, in the form of, for example, a mixed gas with oxygen, from gas introduction port 1105 to oxidation furnace 1101. The temperature within oxidation furnace 1101 is controlled so as to be 600° C. or less by means of heater 1102, and humidification oxidation at low temperatures takes place. Here, the oxidation temperature and the mixing ratio of the water vapor and oxygen are variable, and it is also possible to add argon or nitrogen.

Furthermore, when processing under high temperatures, the pressure is set to an arbitrary level using the pressure regulator 1107 which is attached to gas exhaust port 1106, and the pressure within oxidation 1101 is placed at a setting value. Here, the mixing ratio of the gases and the oxidation temperature are variable at 600° C. or less.

BRIEF DESCRIPTION OF THE DIAGRAMS

(Description of the References)

| | |
|---|---|
| 1100 | apparatus for forming low-temperature oxide films, |
| 1101 | oxidation furnace, |
| 1102 | oxidation furnace heater, |
| 1103 | piping system, |
| 1103a | piping, |
| 1103b–1103e | mass flow controllers (MFC), |
| 1104 | piping heater |
| 1105 | gas introduction port, |
| 1106 | gas exhaust port, |
| 1107 | pressure regulator. |
| 101 | mass flow controller (MFC), |
| 102 | mass flow controller, |
| 103 | mass flow controller, |
| 104 | mixing pipe, |
| 105 | reactor, |
| 106 | optical dew-point meter (water concentration meter), |
| 107 | galvanic battery type oxygen analyzer, |
| 200 | reactor, |
| 400 | reactor, |
| 401 | mass flow controller, |
| 500 | reactor, |
| 501 | mass flow controller, |
| 600 | reactor. |

BEST MODE FOR CARRYING OUT THE INVENTION

Hereinbelow, embodiments of the present invention will be given.

Embodiment 1

Figure 2:
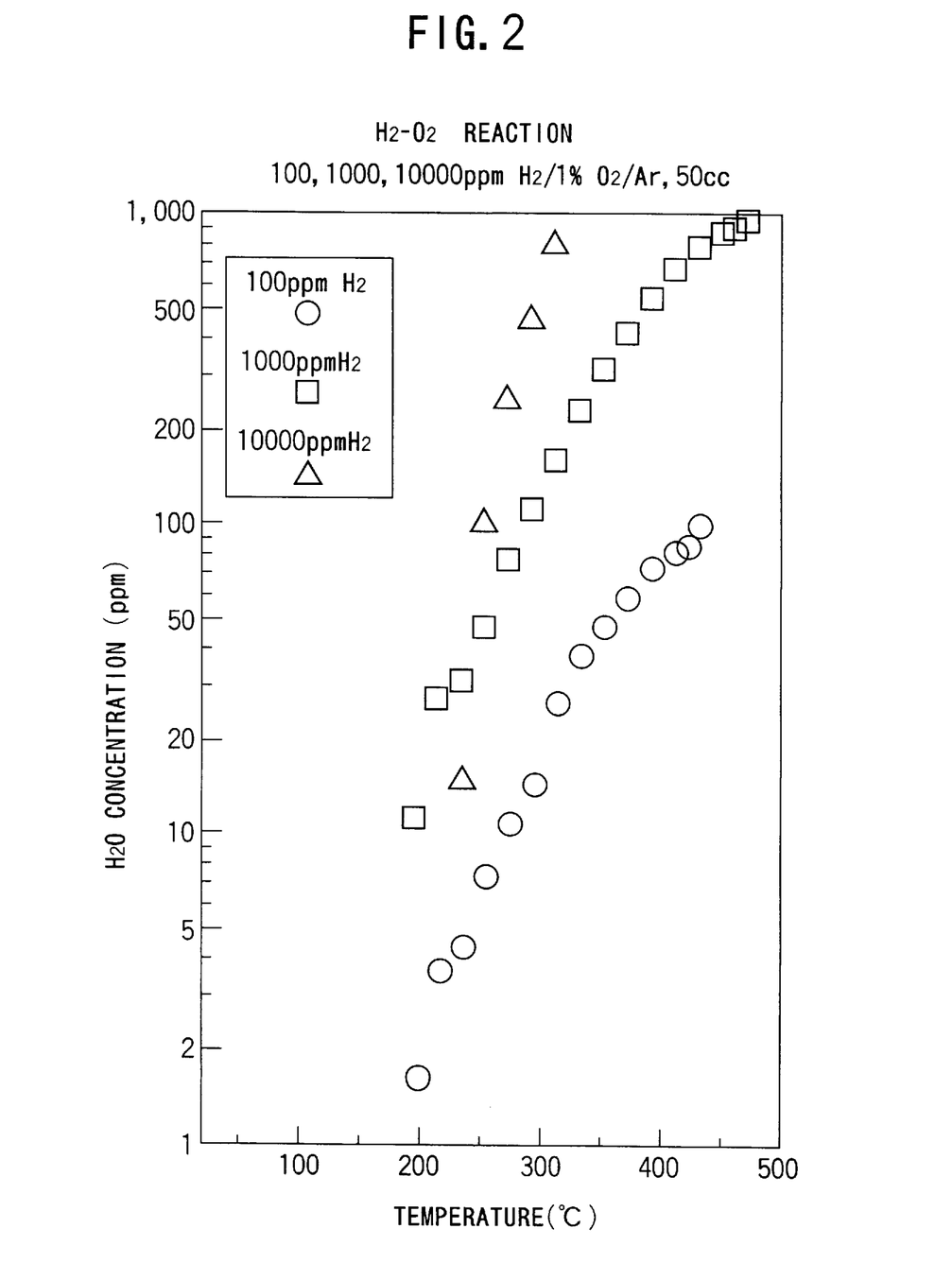
FIG. 2 is a graph showing the amount of water vapor generated when amounts of hydrogen in a range of 100 ppm/1% were added to a mixed gas of 99% argon and 1% oxygen in Embodiment 1.

In FIG. 2, the amount of water vapor generated when an amount of hydrogen within a range of 100 ppm–1% was added to a mixed gas of 99% argon and 1% oxygen is shown. Here, the temperature of the piping was within a range of 200°–400° C.

This indicates that hydrogen can be dissociated by means of the catalytic effect of stainless steel even at temperatures below 700° C., the combustion temperature of hydrogen, and can be reacted with oxygen to form water vapor. Furthermore, the Figure shows that dissociation is complete at a temperature of 450° C.

Embodiment 2

Figure 3:
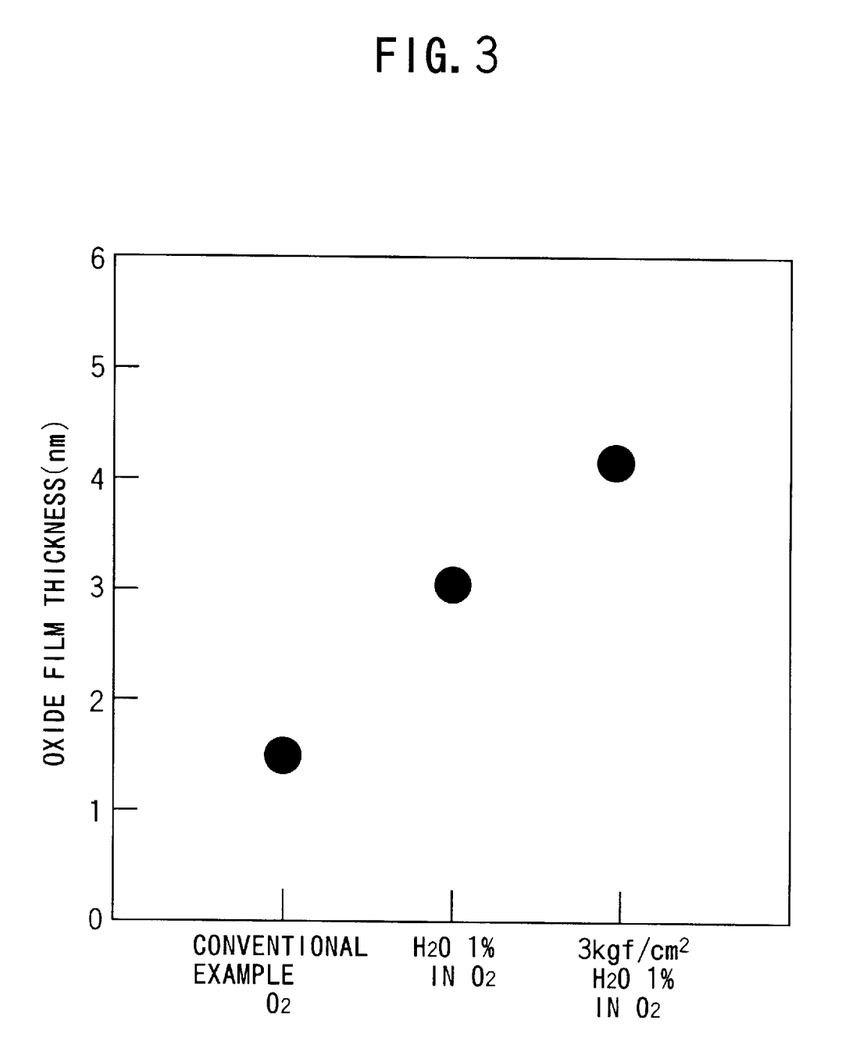
FIG. 3 is a graph showing the oxide film thickness.

FIG. 3 shows the oxide film thickness when oxidation was conducted at a temperature of 600° C. and for a period of one hour, in a gas comprising 99% oxygen and 1% water vapor, where the oxidation pressure was a normal pressure, and an elevated pressure of 3 kg/cm$^2$. For the purposes of comparison, a case was also considered in which an oxide film was formed in a conventional quartz oxidation furnace at identical oxidation temperatures and periods, in a gas composed of solely oxygen and at normal pressures.

This indicates that the speed of oxidation is increased by adding water vapor to oxygen, and that the speed of oxidation is further increased by higher pressures.

Embodiment 3

Figure 4:
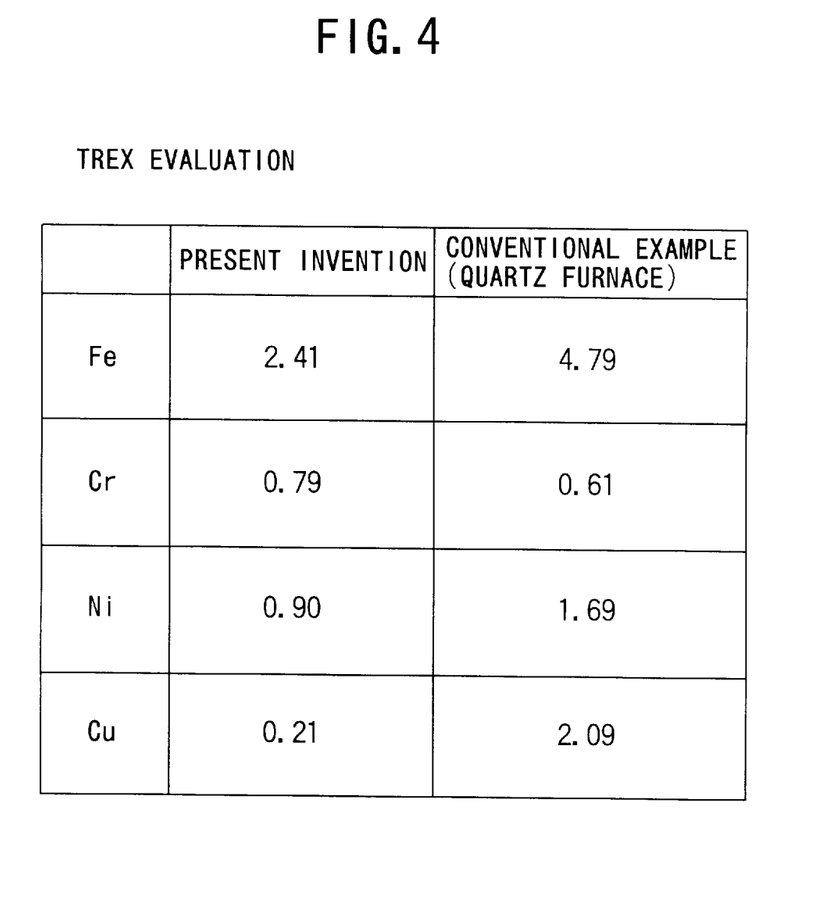
FIG. 4 is a table showing the state of the metal contamination.

The state of metallic contamination of an oxide film formed in a conventional quartz furnace and oxide film in accordance with the method of the present invention were compared. The oxidation conditions were identical to those described in Embodiment 2, respectively. The results are shown in FIG. 4.

In the case in which the method of oxidation employing a conventional furnace was employed, Cu contamination was particularly notable; however, the case in which the oxidation method of the present invention was employed exhibited reduced contamination, apart from Cr. Comparing the two cases, it can be seen that metallic contamination was completely suppressed by the use of the oxidation method in accordance with the present invention.

Embodiment 4

Figure 5:
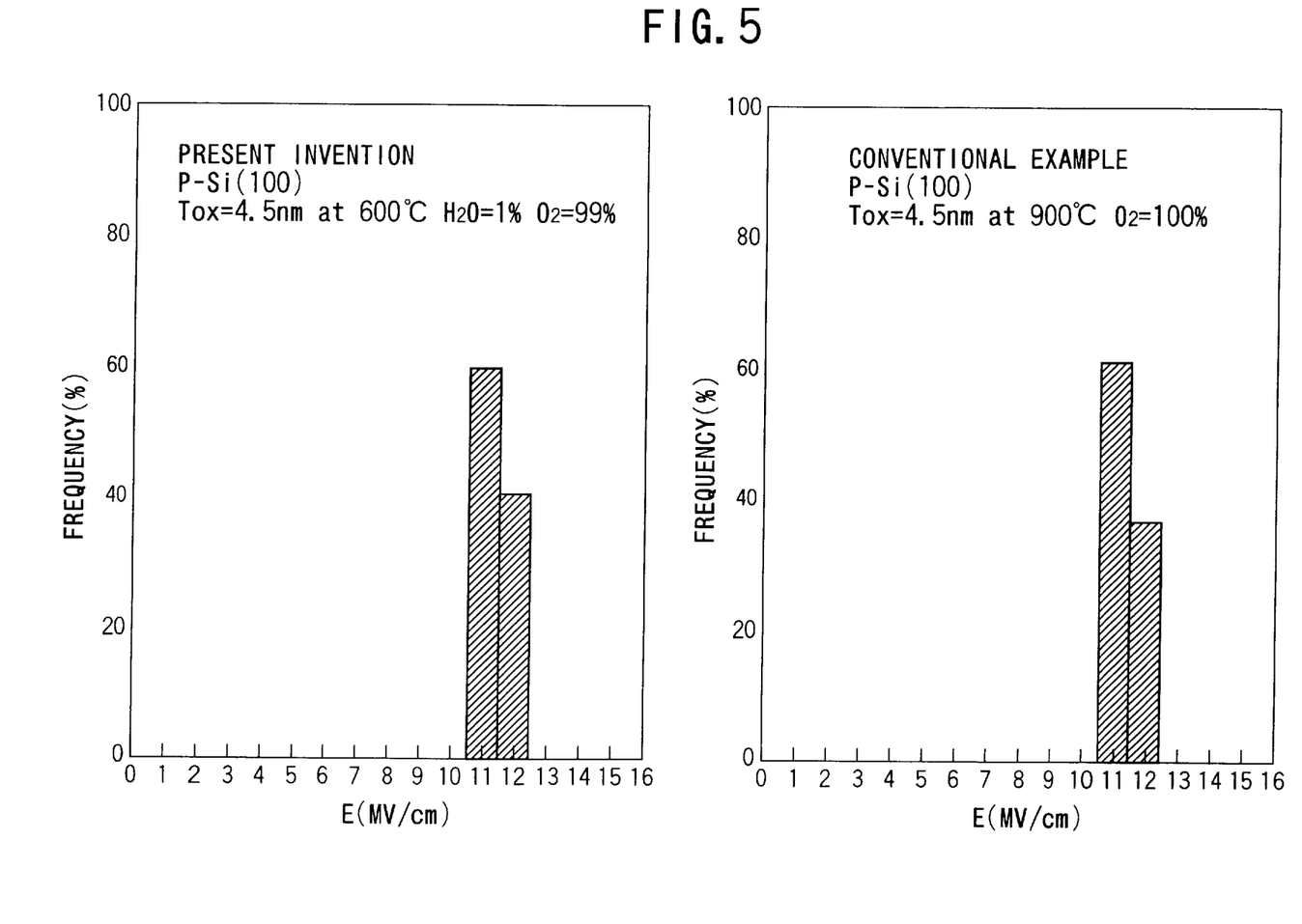
FIG. 5 is a graph showing the insulation pressure resistance of insulating films of MOS formed by means of an embodiment of the method of the present invention.

The insulation pressure resistance characteristics of MOS diodes employing an oxide film formed in a conventional quartz furnace, and an oxide film formed at low oxide film temperatures by means of the present invention, are shown in FIG. 5.

As described above, by means of the use of the apparatus for forming low-temperature oxide films in accordance with the present Embodiment, it is possible to form an oxide film at low temperatures, and it is possible to form a highly pure oxide film.

Hereinbelow, examples of a water generating method and apparatus will be discussed. These may be applied to Embodiments 1–4.

EXAMPLE 1

Figure 6:
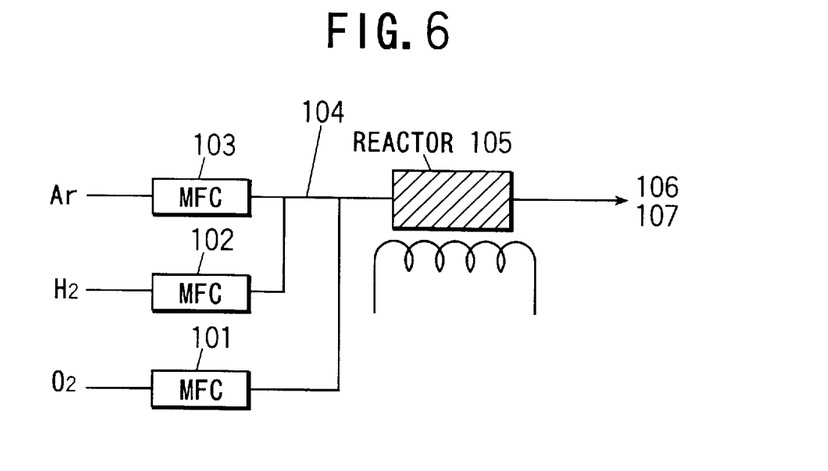
FIG. 6 is a conceptual diagram of a standard water generating apparatus in accordance with Example 1.

The present Example refers to the case in which an arbitrary water concentration is generated using a mixed gas of oxygen, hydrogen, and argon; a conceptual diagram of the apparatus is shown in FIG. 6. As shown in FIG. 6, the flow rate of the oxygen gas is controlled by mass flow controller (MFC) 101, the flow rate of the hydrogen gas is controlled by mass flow controller 102, and the flow rate of the argon gas is controlled by mass flow controller 103; the three types of gases pass through mixing pipe 104 where they are mixed, and are introduced to reactor 105. In reactor 105, the hydrogen and oxygen are reacted, and a mixed gas of hydrogen and argon containing an arbitrary amount of water is generated. An SUS 316L stainless steel pipe (the inner surfaces of which were subjected to electrolytic polishing) having a diameter of ¼" and a length of 2 m was used as reactor 105, and a reduction in reaction temperature was realized using the catalytic action of the inner surface of the stainless steel pipe.

The flow rates of the hydrogen gas and the argon gas were set at, respectively, 50 cc/min and 450 cc/min using mass flow controllers 102 and 103, and varying only the flow rate of the oxygen gas within a range of 0.1–10 cc/min using mass flow controller 101, three types of mixed gases were introduced into the reactor, and the water concentration and oxygen concentration contained in the mixed gas of hydrogen and argon flowing from the reactor were measured using an optical dew-point meter (water concentration meter) 106 and a galvanic battery type oxygen analyzer 107. The hydrogen, oxygen, and inert gasses employed were all super pure gasses having an impurity concentration of 1 ppb or less. The temperature of reactor 105 was maintained at 300° C. over the entire length thereof.

Figure 7:
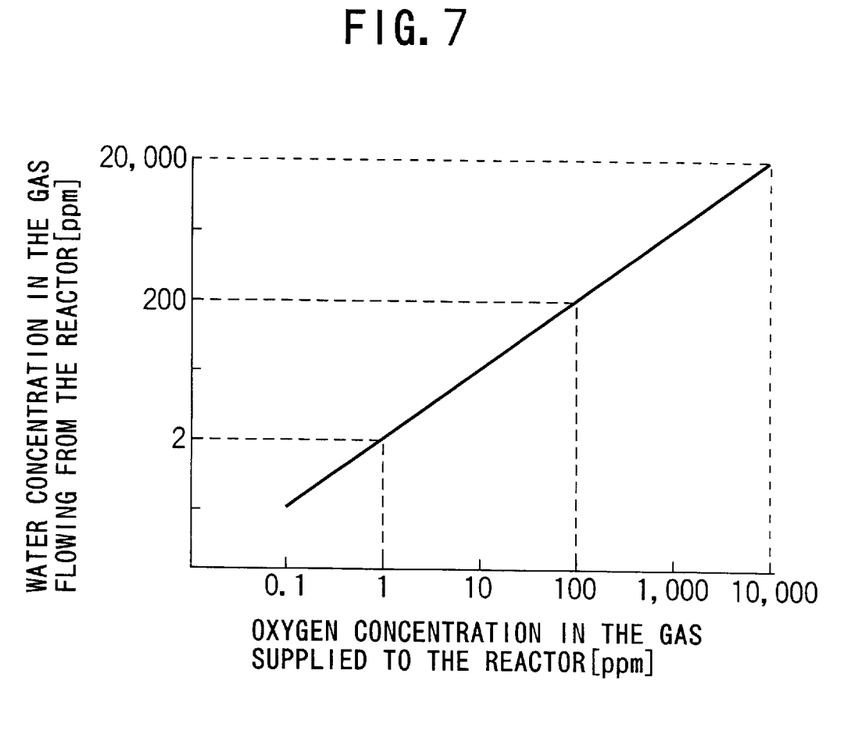
FIG. 7 shows the results of a measurement of water concentration in the gas flowing from a standard water generating apparatus in accordance with Example 1.
Figure 8:
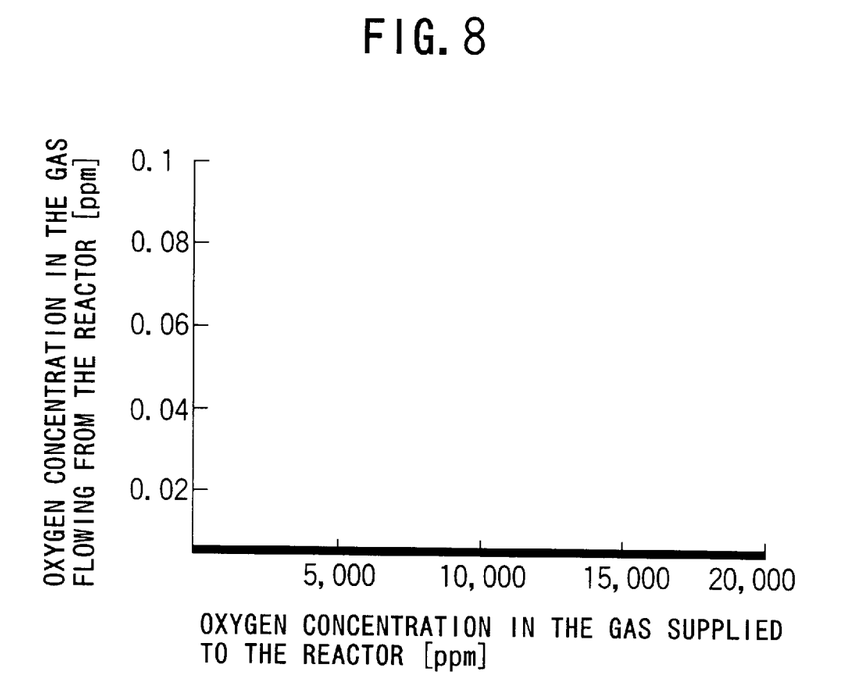
FIG. 8 shows the results of a measurement of oxygen concentration in a gas flowing from a standard water generating apparatus in accordance with Example 1.

The results of this measurement are shown in FIGS. 7 and 8. The horizontal axis indicates the oxygen concentration in the mixed gas of hydrogen, oxygen, and argon, and the vertical axis indicates the hydrogen concentration in the gas flowing from reactor 105. In FIG. 8, the horizontal axis indicates the oxygen concentration in the gas supplied to reactor 105, and the vertical axis indicates the oxygen concentration flowing from reactor 105. From the results of FIG. 7, it can be seen that water was detected in the gas flowing from the reactor at a concentration which was twice the oxygen concentration which was supplied to reactor 105. The water generation concentration was within a range of 100 ppb–2%.

FIG. 8 shows that no matter what the concentration of oxygen supplied to reactor 105, absolutely no oxygen was detected in the gas flowing from reactor 105. That is to say, it was found that a complete reaction of the hydrogen and oxygen occurred in the reactor, and the water which was generated depended on the oxygen concentration supplied to reactor 105.

From these facts, it was determined that in the present Example, it was possible to generate a mixed gas containing an arbitrary concentration of super pure water by means of adjusting the oxygen concentration supplied to reactor 105 using mass flow controller 101.

In the present Example, the temperature of reactor 105 was set at 300° C.; however, even an a temperature of 100° C., identical results were obtained, and it was found that when stainless steel materials were used in reactor 105, any temperature within a range of 100° C.–500° C. was appropriate for use for the temperature of reactor 105.

In the above Example, 100% facility piping super pure gasses were used as the hydrogen, oxygen, and argon (inert gas) gasses; however, it is also possible to use gas tanks having a 100% concentration of these gases, or mixed gas tanks.

Furthermore, the temperature of reactor 105 was set to 300° C.; however, this temperature is closely related to the flow rate of supplied gasses and the volume of the reaction pipe (reaction time), so that there are cases in which the temperature may be less than 300° C.

Furthermore, SUS 316L material was used as the material for the reactor in the present Example; however, any metal may be used insofar as it has a catalytic action which permits a lowering of the temperature of reaction between hydrogen and oxygen. For example, Hastelloy, nickel, platinum, or the like may be used. Furthermore, the entirety of the reaction pipe need not employ metal having a catalytic action; it is acceptable if such metal is used in only a portion of the reaction pipe, for example on those surfaces which are in contact with gas.

EXAMPLE 2

Figure 9:
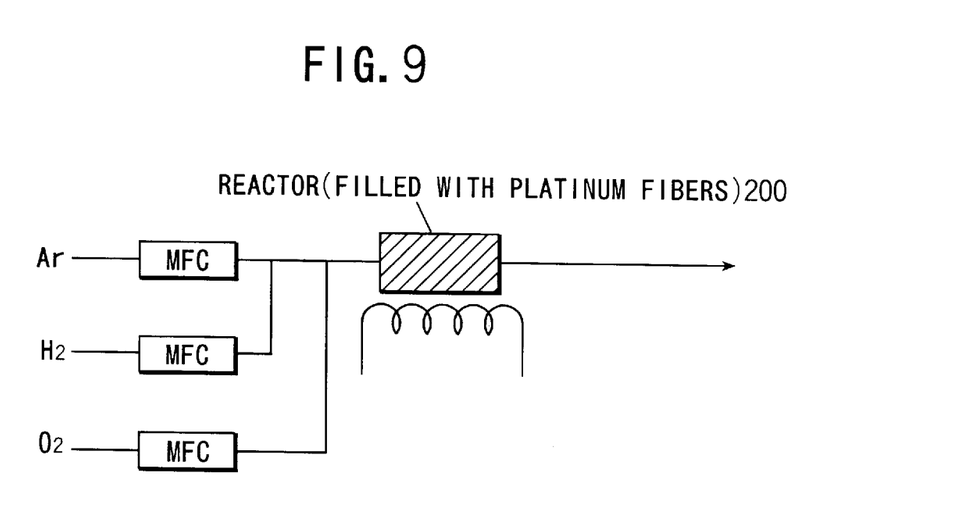
FIG. 9 is a conceptual diagram of a standard water generating apparatus in accordance with Example 2.

In the present Example, the interior of the reactor is filled with catalytic metal in order to reduce the reaction temperature of hydrogen and oxygen gas; a reactor 200, comprising the reactor of Example 1 provided with platinum fiber catalytic material, is employed. A conceptual diagram of the apparatus is shown in FIG. 9. Other points are identical to those in Example 1. It was confirmed that a complete reaction of the hydrogen and oxygen took place even when the temperature of the reactor 200 was 200° C.

EXAMPLE 3

In the present Example, a dilution apparatus is provided upstream from the mass flow controller for hydrogen gas supply, thus making it possible to supply hydrogen gas at low concentrations, and to reduce the water concentration which is generated.

Figure 10:
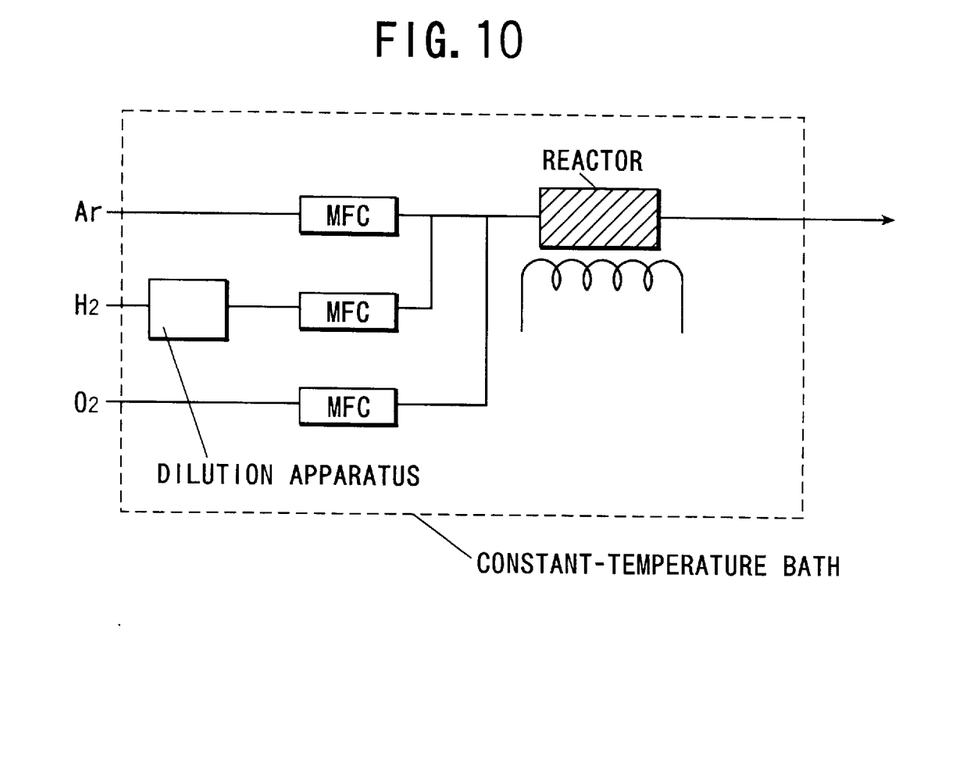
FIG. 10 is a conceptual diagram of a standard water generating apparatus in accordance with Example 3.

When this concentration is reduced, the release of water from the inner walls of the piping or the reactor cannot be ignored. In particular, when the temperature of the piping or reactor changes, the amount of water released from the inner walls changes, so that it is impossible to conduct water generation at stable concentrations. In the present Example, the entirety of the water generating apparatus is disposed within a constant temperature bath, and the amount of water released from the inner walls of the piping or the reactor is maintained at a constant level. A conceptual diagram of the apparatus is shown in FIG. 10.

Other points are identical to those of Example 1. As a result of conducting an evaluation identical to that of Example 1, it was confirmed that because it was possible to reduce the concentration of hydrogen gas which was supplied, water generation became possible within a concentration range of from 10 ppt to 2%, in comparison to the concentration range of water generation of Example 1, which was 100 ppb–2%.

Furthermore, it was confirmed that by maintaining the water generating apparatus at an arbitrary constant temperature, both water generation at concentrations of 2% or more and water generation at stable low concentrations was possible.

EXAMPLE 4

Figure 11:
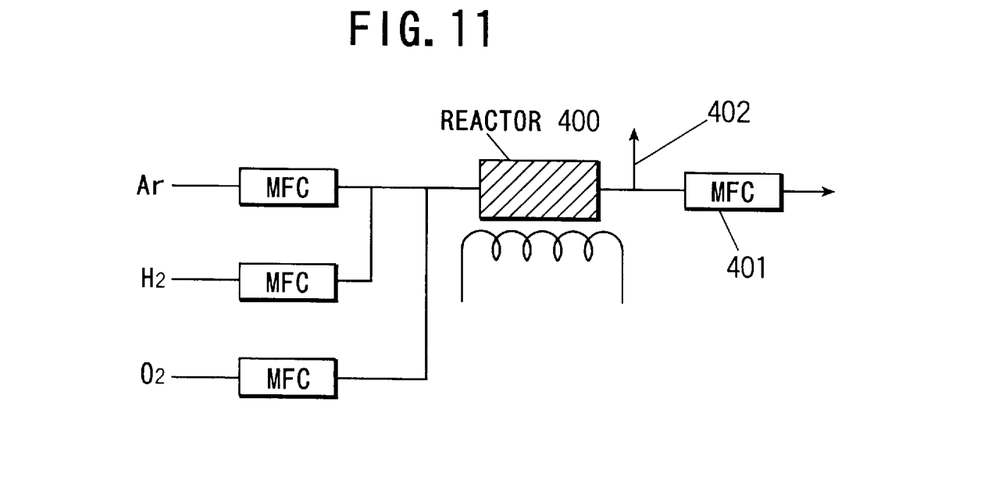
FIG. 11 is a conceptual diagram of a standard water generating apparatus in accordance with Example 4.

In the present Example, gas containing an arbitrary amount of generated water can be supplied at a arbitrary flow rate; a conceptual diagram thereof is shown in FIG. 11. As in Example 1, a mass flow controller 401 is provided downstream from reactor 400 together with a blowoff pipe 402 for blowing off a portion of the gasses flowing from the reactor in order to maintain the pressure between the mass flow controller 401 and the reactor 400 at a constant level.

Other points are identical to those of Example 1. By using the apparatus shown in FIG. 11, it was possible to control the flow rate of the gas containing water, and to supply gas containing an arbitrary water concentration at an arbitrary flow rate. For example, in the case in which the full scale of mass flow controller 401 was 100 cc/min, it was confirmed that flow rate control was possible within a range of from 0.1 to 100 cc/min. When the full scale of mass flow controller 401 was 2 L/min, it was confirmed that flow rate control was possible within a range of 2 cc/min–2 L/min.

EXAMPLE 5

Figure 12:
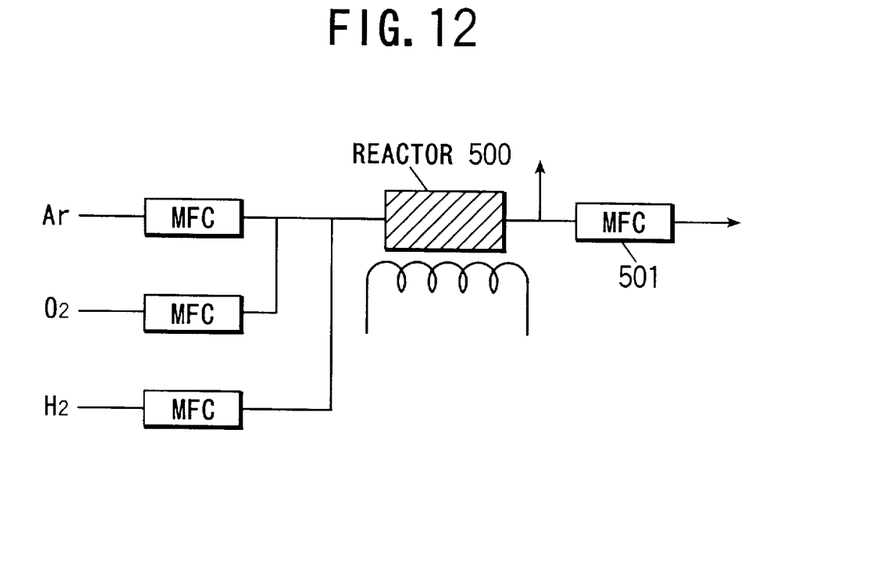
FIG. 12 is a conceptual diagram of a standard water generating apparatus in accordance with Example 5.
Figure 13:
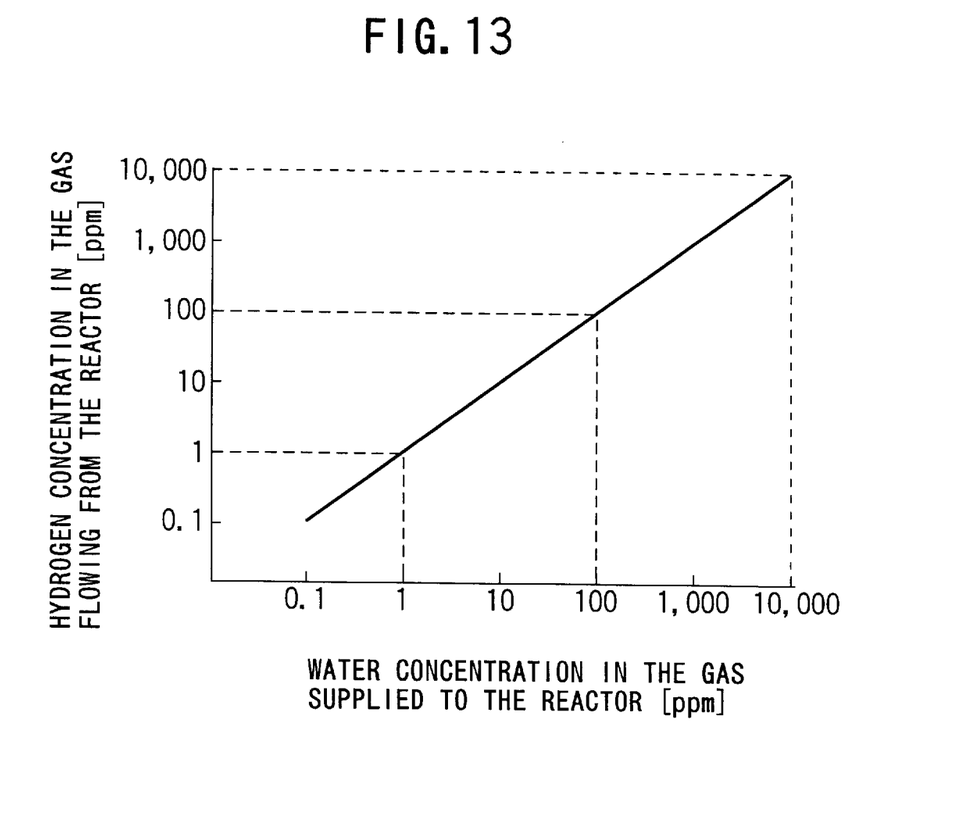
FIG. 13 shows the results of a measurement of water concentration in a gas flowing from a standard water generating apparatus in accordance with Example 5.
Figure 14:
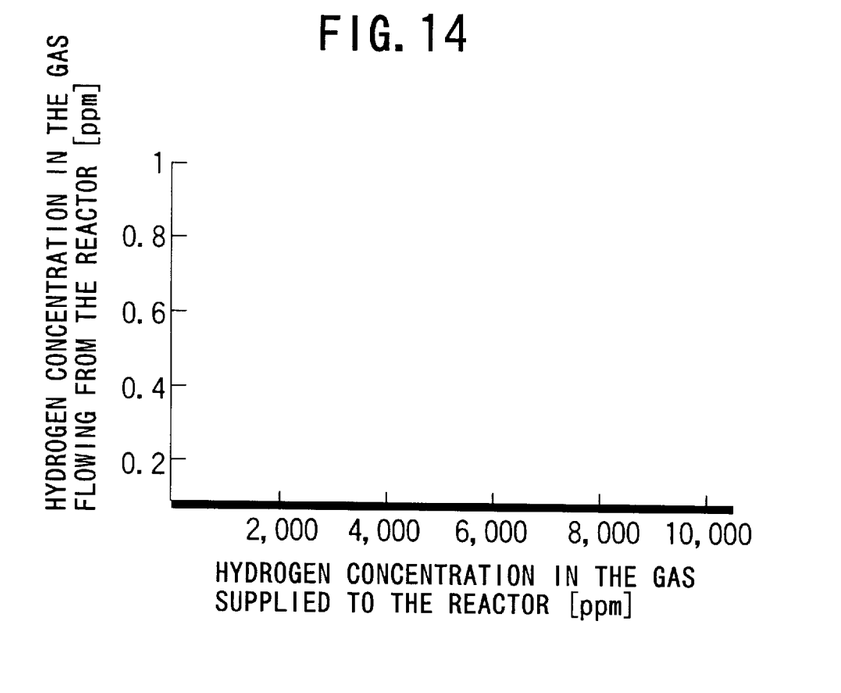
FIG. 14 shows the results of a measurement of hydrogen concentration in a gas flowing from a standard water generating apparatus in accordance with Example 5.

In the present Example, by adjusting the hydrogen concentration, the water concentration which is generated is adjusted. In Examples 1 through 4, an excessive hydrogen concentration was supplied, and the water concentration was determined by the oxygen concentrations; however, here, in a state in which the oxygen concentration was excessive (in the present embodiment, an oxygen concentration of 10%), the water concentration flowing from reactor 500 was controlled by means of the hydrogen concentration which was supplied. In contrast, in the present invention, the reactor temperature was set to 400° C. A conceptual diagram of the apparatus is shown in FIG. 12. The results of the evaluation are shown in FIGS. 13 and 14. It can be seen from the results of FIG. 13 that water was detected in the gas flowing from reactor 500 at a concentration which was equal to the hydrogen concentration supplied to reactor 500. The concentration of water generated was within a range of 100 ppb–1%. From the results of FIG. 14, it can be seen that absolutely no hydrogen gas was detected in the gas flowing from reactor 500 no matter what the concentration of hydrogen supplied to reactor 500. That is to say, a complete reaction of the hydrogen and oxygen occurred in reactor 500, and water was generated in proportion to the hydrogen concentration supplied to reactor 500.

It can be seen from these facts that the apparatus of the present Example is applicable to an apparatus for generating a mixed gas containing an arbitrary amount of super pure water by controlling the hydrogen concentration supplied to reactor 500 in the apparatus of the present invention using mass flow controller 501.

Furthermore, it was confirmed that the present Example was applicable to an apparatus for generating a mixed gas containing an arbitrary amount of super pure water even when the ratio of hydrogen flow rate to oxygen gas flow rate was 2 to 1.

EXAMPLE 6

Figure 15:
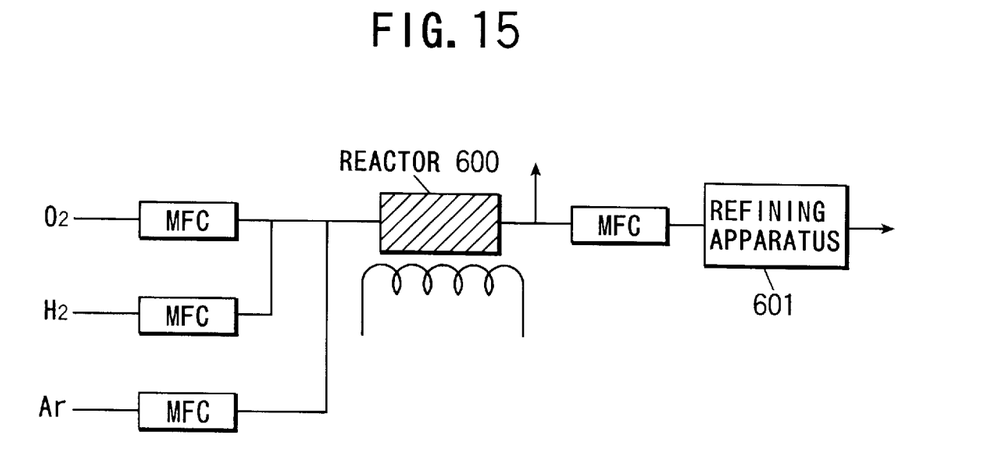
FIG. 15 is a conceptual diagram of a standard water generating apparatus in accordance with Example 6.

In the present Embodiment, the hydrogen gas or oxygen gas remaining in the gas containing water which is generated is removed; in the case in which, as in Examples 1–5, one or the other hydrogen gas or oxygen gas is in excess during the reaction, there are cases in which this excessive hydrogen or oxygen component remains in the gas containing the water which is generated. Accordingly, a refining apparatus 601 which is capable of selectively removing hydrogen or oxygen is installed downstream from reactor 600, and the apparatus supplies gas containing an arbitrary water concentration and which does not contain hydrogen or oxygen; this apparatus is shown in FIG. 15. The generation of a gas containing only water, and neither hydrogen or oxygen, was confirmed.

EXAMPLE 7

Figure 16:
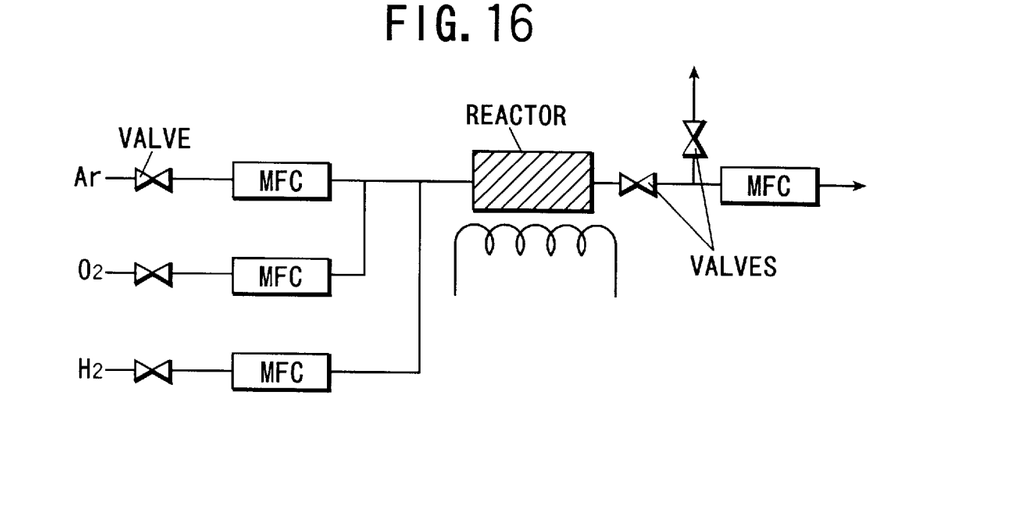
FIG. 16 is a conceptual diagram of a standard water generating apparatus in accordance with Example 7.

The present Example relates to a standard water generating apparatus provided with a gas stopping function; FIG. 16 shows a conceptual diagram of this standard water generating apparatus which is provided with metal stop valves, in consideration of cases in which it is desirable to stop the gases, with respect to Examples 1–6. The generation of a gas containing an arbitrary amount of water was confirmed.

EXAMPLE 8

Figure 17:
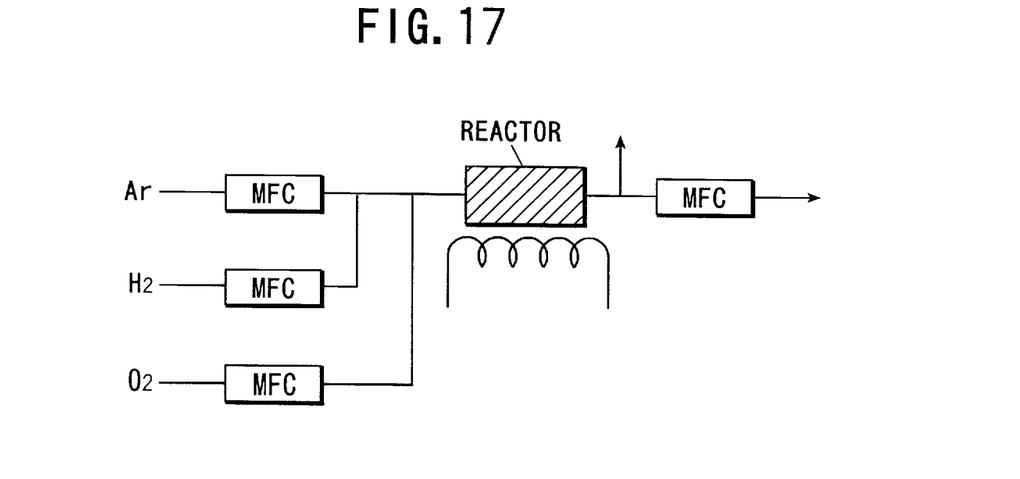
FIG. 17 is a conceptual diagram of a standard water generating apparatus in accordance with Example 8.

In the present Example, in order to accelerate the startup of the standard water generating apparatus, the interior of the standard water generating apparatus is purged with an inert gas, or at least a portion of the standard water generating apparatus is subjected to baking; the structure of the apparatus is identical to that shown in FIG. 11, and is depicted again in FIG. 17. The stable generation of a gas containing 1 ppm of water was confirmed within 30 minutes from the startup of the standard water generating apparatus.

Furthermore, at this time, in the case in which plastic materials are completely eliminated from the portions in contact with gas, and only metallic materials are employed, and furthermore, passivation processing is conducted with respect to the metallic surfaces, only an extremely small amount of gases are released from the surfaces (water, hydrocarbons, and the like), and it becomes possible to generate more highly pure water with a higher degree of precision and within a broader concentration range (ppb–%).

Such passivation processing may be conducted by, for example, the thermal treatment, in an oxidizing or weakly oxidizing atmosphere having an impurity concentration of a few ppb or less, of SUS 316L which has been subjected to electrolytic polishing or electrolytic composite polishing (as in, for example, Japanese Patent Application No. Sho 63-5389 (Japanese Patent Application, First Publication No. Hei 2-85358), and PCT/JP92/699 (WO92-21786), and Japanese Patent Application No. Hei 4-164377).

It should be particularly noted that such passivated films, in addition to the fact that an extremely small amount of water is released from the surfaces thereof, have surfaces which themselves act to create hydrogen and oxygen radicals. Accordingly, the use of a reactor pipe having such passivated films on the inner surfaces thereof is extremely effective in generating water with high precision. In this way, the fact that it is not the base material itself, but rather the oxides of the base elements formed on the surface thereof, which possess the catalytic action capable of creating hydrogen and oxygen radicals, is not easily understood, and is surprising; in the present invention, skillful advantage is taken of characteristics such as the small amount of water released from the surfaces, and this catalytic action.

Industrial Applicability

In accordance with the present invention, semiconductors or metals can be oxidized in a highly pure atmosphere and at low temperatures. The effects of crystal defects in the silicon substrate or warping or twisting of the silicon wafer can be suppressed, and more productive processes become possible. Furthermore, it is to be expected that by reducing the temperature of the oxidizing process, a simplification of the semiconductor manufacturing line will occur.

I claim:

1. A method of forming silicon oxide films, comprising the steps of supplying a gas containing water and oxygen to the interior of an oxidation furnace of an apparatus for forming low-temperature oxide films; said oxidation furnace having a gas supply port and a gas exhaust port, and a heater for heating said oxidation furnace to an arbitrary temperature, said apparatus further comprising a gas supply system disposed upstream of said oxidation furnace and provided with a mechanism for providing an arbitrary amount of water or a mechanism for generating an arbitrary quantity of water, said oxidation furnace, said gas supply system and junction portions thereof being constructed of metallic materials; and heating and oxidizing a sample within said oxidation furnace at low temperatures of 600° C. or less and under pressures of 1 kg/cm² or more.

2. A method of forming silicon oxide films in accordance with claim 1, wherein said gas is supplied at water concentrations within a range of 0.1–5 vol. %, and oxygen concentrations of 1 vol. % or more.

3. An apparatus for forming silicon oxide films comprising an oxidation furnace having a gas supply port and a gas exhaust port; a heater for heating said oxidation furnace to an arbitrary temperature; and a gas supply system disposed upstream of said furnace and provided with a mechanism for adding for generating an arbitrary quantity of water;

said oxidation furnace, said gas supply system, and junction portions thereof comprise metallic materials and diffusion of impurities from outside the system is completely eliminated.

4. An apparatus for forming silicon oxide films according to claim 3, wherein inner surfaces of said oxidation furnace and said gas supply system are covered with a thermal oxide passivated film.

5. An apparatus for forming silicon oxide films according to claim 3, wherein parts in said gas supply system are made of stainless steel.

6. An apparatus for forming silicon oxide films comprising an oxidation furnace having a gas supply port and a gas exhaust port; a heater for heating said oxidation furnace to an arbitrary temperature; and a gas supply system disposed upstream of said oxidation furnace and provided with a mechanism for generating an arbitrary quantity of water;

wherein said oxidation furnace, said gas supply system, and junction portions thereof comprise metallic materials; and wherein said gas supply system comprises a reactor capable of generating an arbitary amount of water by means of a catalytic reaction between oxygen and hydrogen at a temperature of 500° C. or less, and a heater for heating said reactor.

7. An apparatus for forming silicon oxide films according to claim 6, wherein parts in said gas supply system are made of stainless steel.

* * * * *